US012621973B2

(12) United States Patent (10) Patent No.: US 12,621,973 B2
Inaura (45) Date of Patent: May 5, 2026

(54) IMAGE PROCESSING DEVICE, MOUNTING DEVICE, AND IMAGE PROCESSING METHOD

(71) Applicant: FUJI CORPORATION, Chiryu (JP)

(72) Inventor: Yuki Inaura, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 771 days.

(21) Appl. No.: 17/995,633

(22) PCT Filed: Apr. 8, 2020

(86) PCT No.: PCT/JP2020/015873
§ 371 (c)(1),
(2) Date: Oct. 6, 2022

(87) PCT Pub. No.: WO2021/205578

PCT Pub. Date: Oct. 14, 2021

(65) Prior Publication Data

US 2023/0217636 A1 Jul. 6, 2023

(51) Int. Cl.
*B23P 19/00* (2006.01)
*H05K 13/02* (2006.01)
*H05K 13/04* (2006.01)
*H05K 13/08* (2006.01)

(52) U.S. Cl.
CPC ............. *H05K 13/08* (2013.01); *H05K 13/02* (2013.01)

(58) Field of Classification Search
CPC .... H05K 13/02; H05K 13/0419; H05K 13/08; H05K 13/0813; G06T 7/0008
See application file for complete search history.

(56) References Cited

U.S. PATENT DOCUMENTS

2004/0075067 A1 4/2004 McAuliffe
2018/0098467 A1* 4/2018 Nakamura ........... H05K 13/086
2018/0228067 A1* 8/2018 Chi ........................ H05K 13/08
2023/0108672 A1* 4/2023 Kito ................... H05K 13/0419
382/207

FOREIGN PATENT DOCUMENTS

JP 2014-72409 A 4/2014
WO WO 2005/092568 A1 10/2005

OTHER PUBLICATIONS

International Search Report mailed on Jul. 7, 2020 in PCT/JP2020/015873 filed on Apr. 8, 2020 (2 pages).

* cited by examiner

*Primary Examiner* — Paul D Kim
(74) *Attorney, Agent, or Firm* — Oblon, McClelland, Maier & Neustadt, L.L.P.

(57) ABSTRACT

An image processing device for processing an image of a tape having provided therein multiple cavities for receiving a component as a supply target includes a feature amount acquisition section configured to extract brightnesses of pixels within a predetermined range which can include a bottom surface of the cavity and a component inside the cavity using the image and acquire a value indicating scatter of the extracted brightnesses as a feature amount, and a determination section configured to determine on existence or non-existence of a component inside the cavity based on a determination threshold determined based on the feature amount for each of a case in which a component exists inside the cavity and a case in which no component exists inside the cavity and the feature amount acquired from the image.

7 Claims, 6 Drawing Sheets

FEEDING DIRECTION

IMAGE PROCESSING DEVICE, MOUNTING DEVICE, AND IMAGE PROCESSING METHOD

TECHNICAL FIELD

The present description discloses an image processing device, a mounting device, and an image processing method.

BACKGROUND ART

Conventionally, there has been proposed a device for capturing an image of a tape in which multiple cavities for receiving a component are provided to thereby determine on existence or non-existence of a component inside a cavity based on a feature amount acquired from the image (for example, refer to Patent Literature 1). With this device, a mean value of brightnesses of pixels is calculated as a feature amount, and the mean value so calculated is compared with a threshold set based on the brightness of a body portion of a component or a threshold set based on the brightness of a cavity to thereby determine on existence or non-existence of component. As a result, a retry operation, which is triggered by a pickup failure of a component, is prevented, or a component shortage in a tape is grasped.

PATENT LITERATURE

Patent Literature 1: JP-A-2014-072409

BRIEF SUMMARY

Technical Problem

Here, since the brightness of a body portion or the like of a component differs from a component type to a component type, in the device described above, a threshold need be set for each component type, whereby the determination processing becomes complicated and troublesome. In addition, since the brightness of a body portion of a component can be changed depending on imaging conditions even in the same component type, with the determination method in which the brightness of a body portion of a component is compared with a threshold based on the brightness of the body portion or a threshold based on the brightness of a cavity, there is a possibility that an erroneous determination is made by different imaging conditions.

A main object of the present disclosure is to determine accurately on existence or non-existence of a component inside a cavity.

Solution to Problem

The present disclosure employs the following means in order to achieve the main object described above.

According to the gist of the present disclosure, there is provided an image processing device for processing an image of a tape having provided therein multiple cavities for receiving a component as a supply target, the image processing device including:

a feature amount acquisition section configured to extract brightnesses of pixels within a predetermined range which can include a bottom surface of the cavity and a component inside the cavity using the image and acquire a value indicating scatter of the extracted brightnesses as a feature amount; and a determination section configured to determine on existence or non-existence of a component inside the cavity based on a determination threshold determined based on the feature amount for each of a case in which a component exists inside the cavity and a case in which no component exists inside the cavity and the feature amount acquired from the image.

The image processing device of the present disclosure acquires the value indicating the scatter of the brightnesses extracted from the predetermined range of the image as the feature amount and determines on existence or non-existence of a component inside the cavity based on the determination threshold determined based on the feature amount for each of the case in which a component exists inside the cavity and the case in which no component exists inside the cavity and the feature amount acquired from the image. Here, in case a component exists inside the cavity, the scatter of brightnesses becomes large since the bottom surface of the cavity and the component are captured within the predetermined range, whereas in case no component exists inside the cavity, the scatter of brightnesses becomes small since only the bottom surface of the cavity is captured in the predetermined range. As a result, whether component types, imaging conditions, or the like differs, the feature amounts acquired from the image exhibit the same tendency depending on existence or non-existence of a component inside the cavity. Therefore, even though components types, imaging conditions, or the like differs, existence or non-existence of a component inside the cavity can be determined accurately.

DESCRIPTION OF EMBODIMENTS

Figure 1:
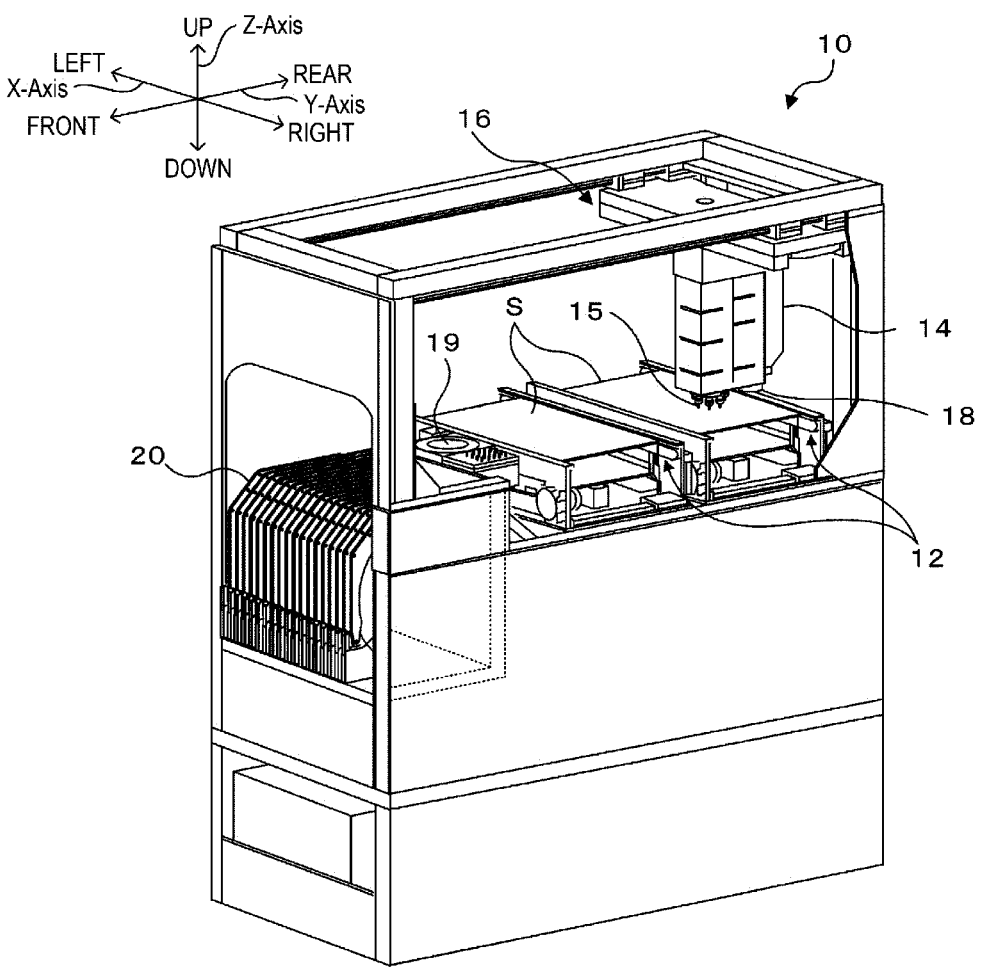
FIG. 1 A schematic configuration diagram of mounting device 10.
Figure 2:
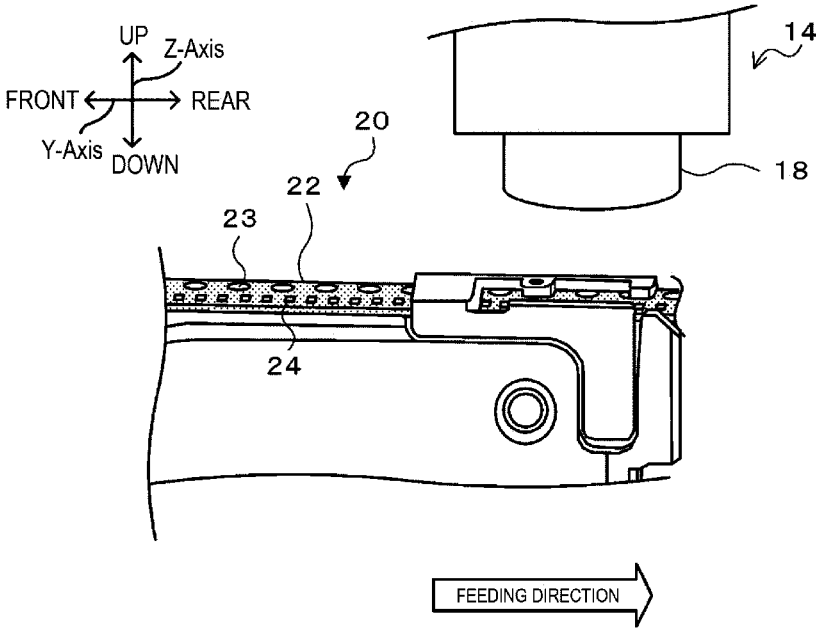
FIG. 2 A schematic configuration diagram of feeder 20.
Figure 3:
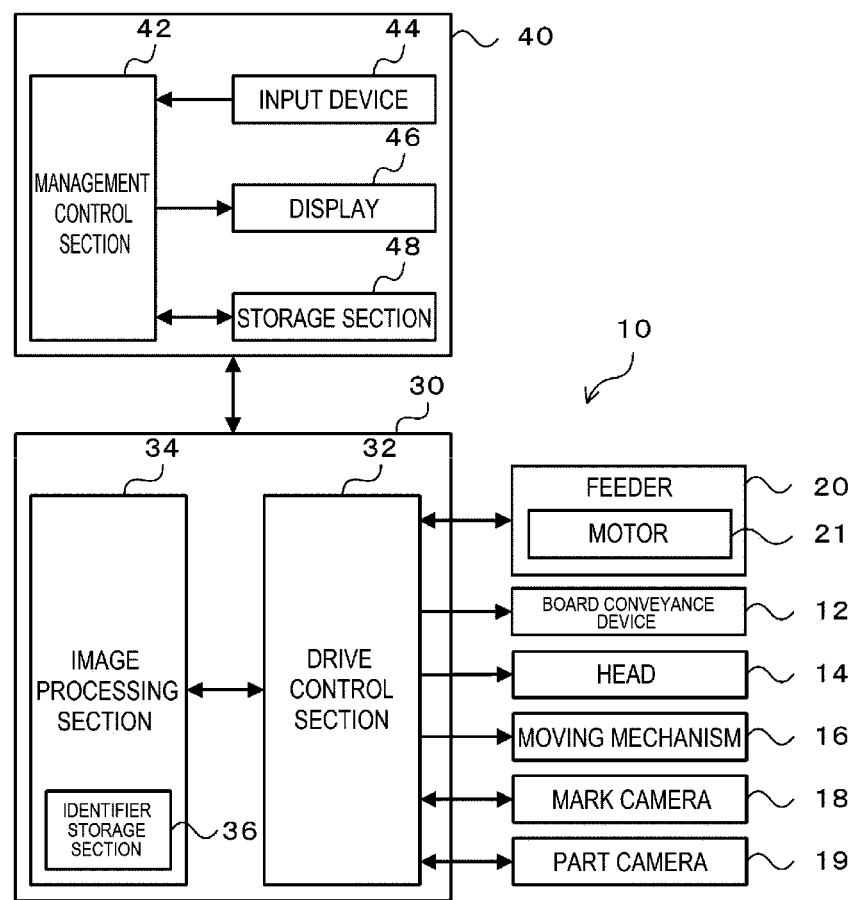
FIG. 3 A block diagram illustrating a configuration regarding a control of mounting device 10.

Next, an embodiment of the present disclosure will be described with reference to drawings. FIG. 1 is a schematic configuration diagram of mounting device 10. FIG. 2 is a schematic configuration diagram of feeder 20. FIG. 3 is a block diagram illustrating a configuration regarding a control of mounting device 10. In the present embodiment, in FIG. 1, a left-right direction denotes an X-axis direction, a front-rear direction denotes a Y-axis direction, and an up-down direction denotes a Z-axis direction.

As illustrated in FIG. 1, mounting device 10 includes feeder 20 for supplying components P, board conveyance device 12 for conveying board S, head 14 for picking up component P with suction nozzle 15 to mount relevant component P on board S, and moving mechanism 16 for moving head 14 in XY directions. In addition, mounting device 10 includes mark camera 18 for imaging various marks affixed to board S, feeder 20, and the like from above, part camera 19 for imaging component P picked up by suction nozzle 15 or the like from below, and control device 30 (refer to FIG. 3) for governing the control of the whole of mounting device 10. Head 14 has one or multiple suction nozzles 15. Suction nozzle 15 is lifted up and lowered in the up-down direction by a Z-axis motor, not illustrated.

Feeder 20 includes a reel, not illustrated, around which tape 22 is wound, and is detachably attached to mounting device 10 with an exchanging device, not illustrated, or by an operator. Tape 22 has multiple cavities 24 of a concave shape for accommodating component P which are formed along a feeding direction (a longitudinal direction) of tape 22. In addition, tape 22 has multiple feeding holes 23 which are formed therein in such a manner as to be brought into engagement with sprocket teeth formed on an outer circumference of a sprocket, not illustrated. Feeder 20 intermittently feeds tape 22 by a predetermined amount to the rear in the Y-direction (the feeding direction) by driving motor 21 (refer to FIG. 3) so as to intermittently rotate the sprocket, so that component P is supplied to a component supply position where head 14 (suction nozzle 15) can pick it up.

Control device 30 includes CPU, ROM, RAM, HDD, and the like, which are not illustrated. Control device 30 includes, as illustrated in FIG. 3, drive control section 32 for driving individual sections, and image processing section 34 for processing images captured by mark camera 18 and part camera 19, as a functional block. Drive control section 32 outputs control signals to motor 21 of feeder 20, board conveyance device 12, head 14, moving mechanism 16, mark camera 18, part camera 19, and the like. Various pieces of information on component P from a control section of feeder 20, an image signal from mark camera 18, an image signal from part camera 19, and the like are input into drive control section 32. Image signals from mark camera 18 and part camera 19 are processed in image processing section 34. Image signals may be input directly into image processing section 34. In addition, control device 30 is connected with management device 40 for managing information on a mounting process so as to enable a bidirectional communication therebetween via a communication network, whereby control device 30 and management device 40 exchange data and control signals therebetween.

Figure 4:
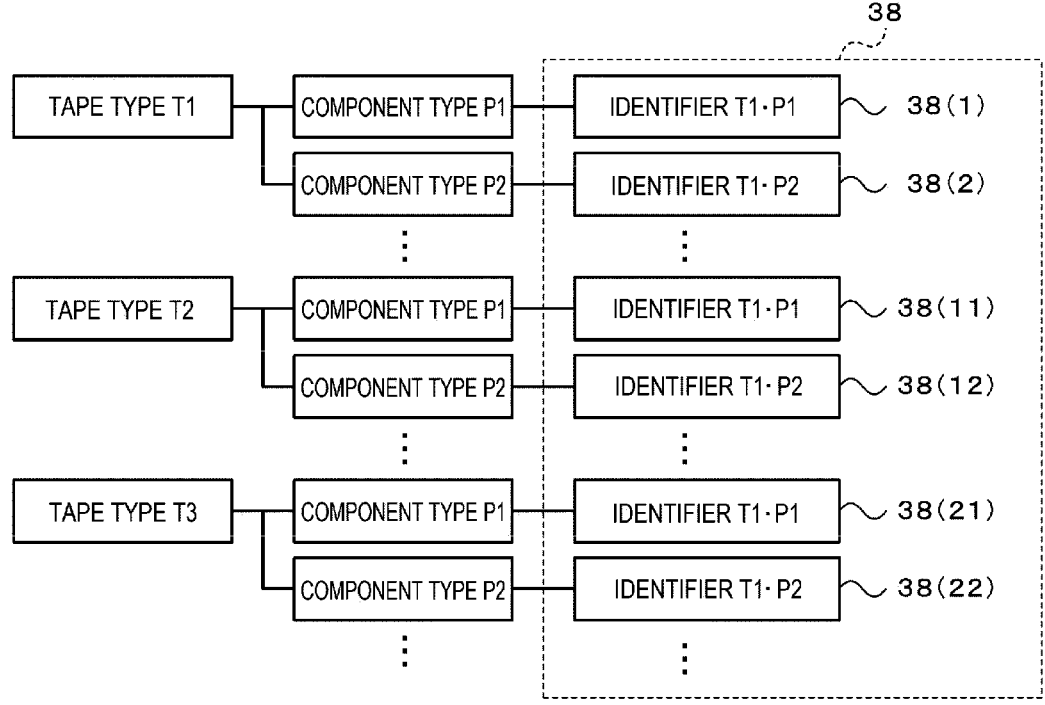
FIG. 4 An explanatory diagram illustrating an example of an identifier 38.

Image processing section 34 includes an identifier storage section 36. Identifier storage section 36 stores multiple identifiers 38 for determining on existence or non-existence of component P inside cavity 24 in tape 22. FIG. 4 is an explanatory diagram illustrating an example of identifier 38. As illustrated therein, in the present embodiment, multiple identifiers 38 are stored which are associated with tape types that denote types of tapes 22 and component types that denote types of components P. For example, there are identifier 38 (1) which is associated with tape type T1 and component type P1, identifier 38 (2) which is associated with tape type T1 and component type P2, and the like. For example, a white paper tape, a black embossed tape, a transparent embossed tape, and the like are raised as tape types T1, T2, T3, . . . , and when imaged, those tapes exhibit different brightnesses due to difference in material, color, transmissivity, and the like. For example, an angular chip component, a bump component, a lead component, and the like are raised as component types P1, P2, . . . , and when imaged, those components exhibit different brightnesses due to difference in material, color, shape, and the like. Each identifier 38 is produced by, for example, imaging tape 22 (cavities 24) using mark camera 18, outputting the image so captured to a computer such as management device 40, and learning a feature amount extracted from the image using an image processing function of the computer. Details of the feature amount and learning thereof will be described later.

Management device 40 is a general-purpose computer, and as illustrated in FIG. 3, includes management control section 42, input device 44 such as a keyboard or a mouse, display 46, and storage section 48 such as HDD or SSD. Management control section 42 is made up of CPU, ROM, RAM, and the like, and receives input signals from input device 44 while outputting image signals to display 46. Storage section 48 stores a production plan of boards S. The production plan of board S is a plan that defines mounting positions and mounting orders of components P on a mounting surface of board S in mounting device 10, a production number of boards S on which components P are so mounted, and the like. Management device 40 outputs a command signal to control device 30 so that components P are mounted in accordance with the production plan, and causes mounting device 10 to execute a mounting process.

Figure 5:
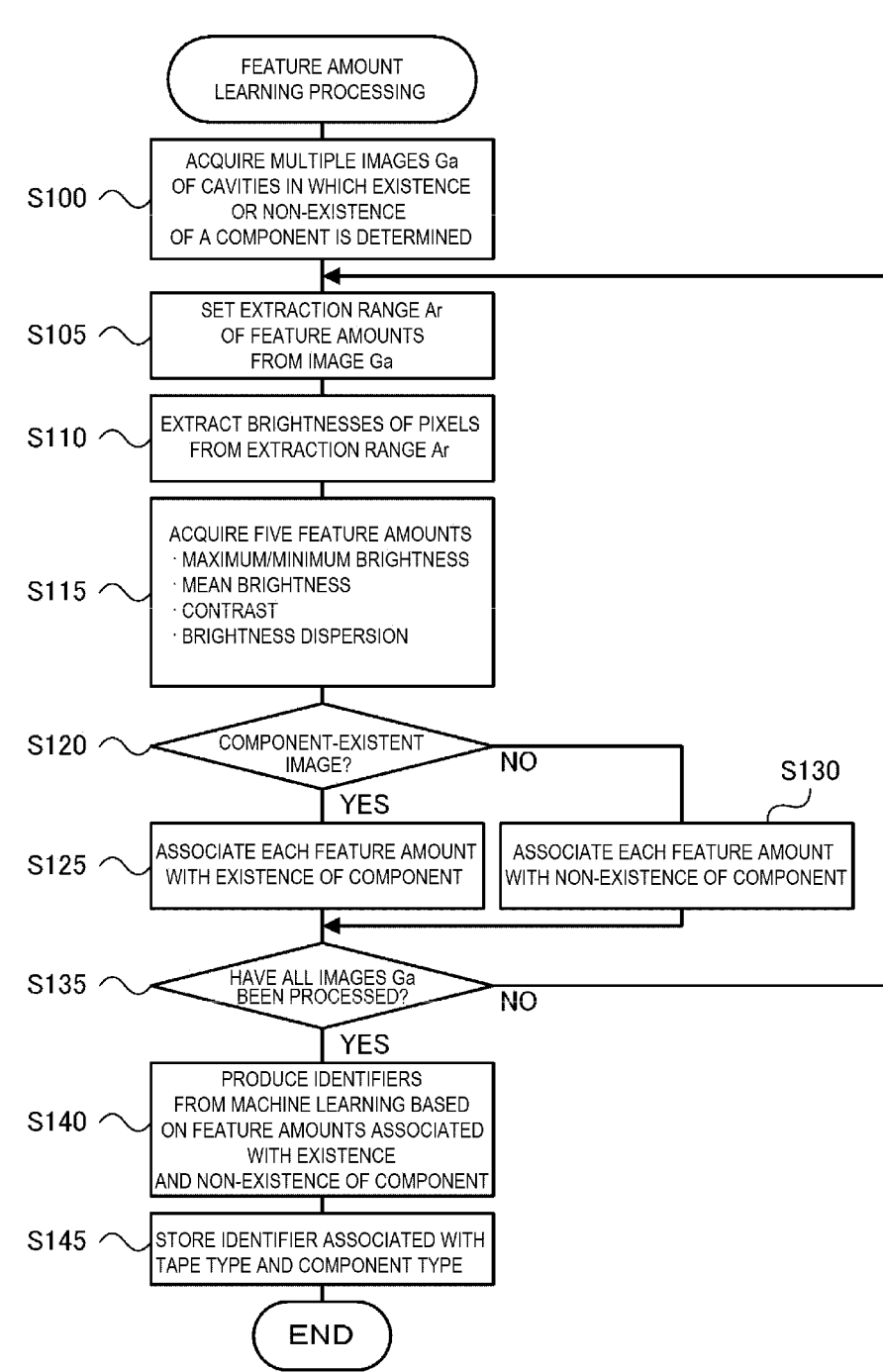
FIG. 5 A flowchart showing an example of feature amount learning processing.

Hereinafter, an operation of mounting device 10, which is configured as has been described heretofore, will be described. Here, processing of determination on existence or non-existence of a component inside cavity 24 will be described. Learning processing which is executed when producing identifier 38 will be described first, and then, determination processing of determination on the existence of a component using identifier 38 will be described. FIG. 5 is a flowchart showing an example of feature amount learning processing. This processing is executed by management control section 42 of management device 40 but may be executed by another computer.

In this processing, management control section 42 acquires multiple images Ga of cavities 24, which have already been determined on the existence of a component, captured using mark camera 18 (S 100). In step S100, for example, a component-existent image captured by imaging cavities 24 accommodating therein component P as of unused tape 22 and a component-non-existent image captured by imaging cavities 24 accommodating therein no component P as of used tape 22 from which all components P have been supplied are acquired. In addition, let's assume that each component-existent image is captured for the same tape type and the same component type and that each component-non-existent image is captured for the same tape type as that used in capturing the component-existent image. The following processing operations may be executed in parallel while sequentially acquiring captured images Ga.

Next, management control section 42 sets extraction range Ar for feature amounts from one image Ga (S105), and extracts brightnesses of pixels from extraction range Ar so set (S 110). Subsequently, management control section 42 acquires five feature amounts of maximum brightness, minimum brightness, mean brightness, contrast, and brightness dispersion based on the brightnesses of the pixels so extracted (S115). Contrast is acquired, for example, as a ratio of a maximum brightness to a minimum brightness. Brightness dispersion is acquired by dividing a total sum of squares of deviations between brightness and mean brightness of pixels by the number of pixels. Management control section 42 may acquire a standard deviation in place of dispersion. In addition, management control section 42 determines whether current image Ga is a component-existent image (S120), and if management control section 42 determines that current image Ga is a component-existent image, management control section 42 associates the feature amounts acquired in S115 with existence of component (S125), whereas if management control section 42 determines that current image Ga is not a component-existent image but a component-non-existent image, management control section 42 associates the feature amounts acquired in S115 with non-existence of component (S130).

Figure 6:
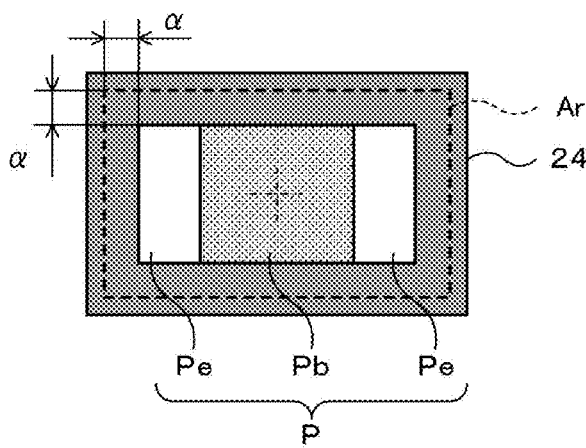
FIG. 6 An explanatory diagram illustrating an example of a component-existent image.
Figure 7:
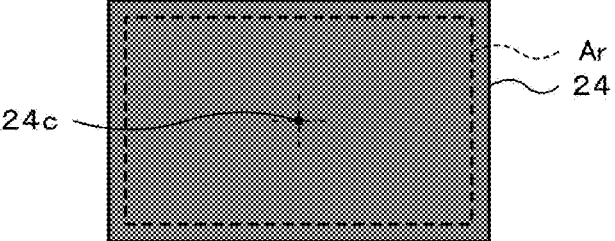
FIG. 7 An explanatory diagram illustrating an example of a component-non-existent image.
Figure 8:
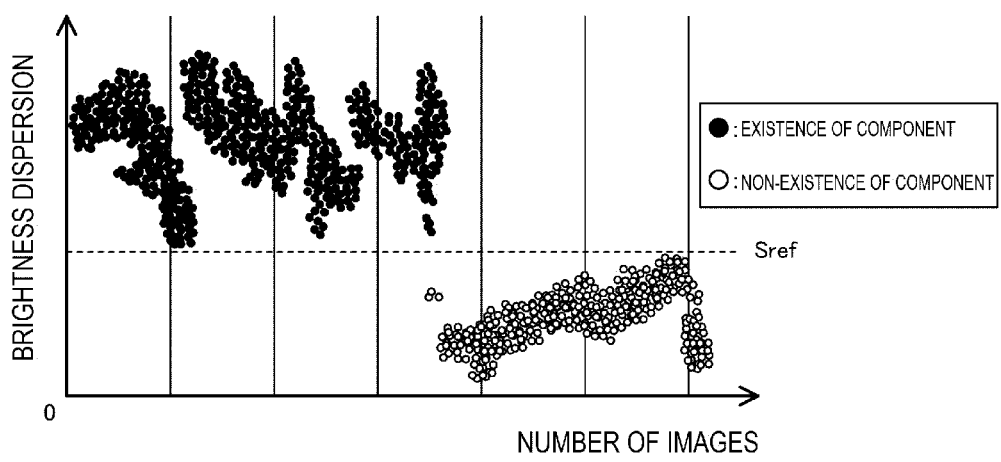
FIG. 8 An explanatory diagram illustrating an example of relationships between component existence and component non-existence and corresponding feature amounts.

Here, FIG. 6 is an explanatory diagram illustrating an example of a component-existent image, FIG. 7 is an explanatory diagram illustrating an example of a component-non-existent image, and FIG. 8 is an explanatory diagram illustrating an example of relationships between component existence and component non-existence and corresponding feature amounts. Extraction range Ar set in S105 is defined as, for example, a range resulting from adding margin α to both vertical and horizontal sides of a rectangular upper surface size of component P. Margin α may be a constant value or may be a value proportional to the size of component P. In addition, vertical margin α and horizontal margin α are not limited to the same value and hence may be different values. A center position of extraction range Ar is determined so as to coincide with, for example, center position 24c (a predetermined supply position) of component P inside cavity 24 when relevant component P is picked up by suction nozzle 15. As a result, even if component P is misaligned inside cavity 24, the upper surface of component P and a bottom surface of cavity 24 are included in an image.

In addition, in FIG. 6, electrode Pe is shown as being provided on each end of body Pb of component P. As a result, the brightness scatters in the component-existent image due to difference in reflection of light from individual portions, and for example, there is a tendency that the brightness of electrode Pe becomes the highest, the brightness of body Pb becomes higher, and the brightness of the bottom surface of cavity 24 becomes the lowest. Although this tendency differs depending on tape type or component type, normally, since the brightness of the upper surface of component P differs from the brightness of the bottom surface of cavity 24, the respective brightnesses of the pixels tend to scatter easily. On the other hand, as illustrated in FIG. 7, with the component-non-existent image, since only the bottom surface of cavity 24 is captured in the image, the respective brightnesses of the pixels are distributed uniformly at a relatively low brightness, there is a tendency that the brightnesses scatter less. In the case of a black embossed tape, the tendency becomes remarkable, and even in the case of a white paper tape, the tendency is likely to appear. However, in the case of a transparent embossed tape, reflection light from a constituent member of feeder 20 located below tape 22 is transmitted therethrough, and the brightness differs depending on the material of the constituent member. That is, when compared with the black embossed tape and the white paper tape, with the transparent embossed tape, there may be a case in which the scatter of brightnesses increases due to the influence of disturbance.

In addition, in FIG. 8, an axis of abscissa represents the number of images Ga (the number of data), an axis of ordinate represents brightness dispersion, which is one of the feature amounts, component existence is shown by a black circle, and component non-existence is shown by a white circle. Since brightness tends to scatter more easily when a component exists than when no component exists, the brightness dispersion takes a relatively large value when a component exists, while the brightness dispersion takes a relatively small value when no component exists. In addition, in FIG. 8, a boundary of brightness dispersion between component existence and component non-existence appear, and brightness dispersion threshold Sref for determination of component existence or non-existence can be set based on the boundary.

When management control section 42 associates the feature amounts with existence or non-existence of a component in S125, S130 of the feature amount learning processing, management control section 42 determines whether all images Ga have been processed (S135), and if management control section 42 determines that there remain image or images Ga which have not yet been processed, management control section 42 returns to S105 to execute the processing operations from S105 and onwards. On the other hand, if management control section 42 determines in S135 that all images Ga have been processed accordingly, management control section 42 produces identifiers 38 by machine learning using the feature amounts associated with existence and non-existence of a component (S 140). In the machine learning, the five feature amounts are classified based on existence or non-existence of a component to determine an identification boundary through, for example, a support vector machine (SVM) or an AdaBoost, whereby identifiers 38 are produced in which thresholds, which are used to determine on existence or non-existence of a component, are set based on the identification boundary.

Then, management control section 42 associates identifiers 38 so produced with tape types and component types and stores relevant identifiers 38 in identifier storage section 36 (S 145), ending the feature amount learning processing. A configuration may be adopted in which control management section 42 stores multiple identifiers 38 in storage section 48 and then transmits required identifier 38 to image processing section 34 for use therein as required.

Figure 9:
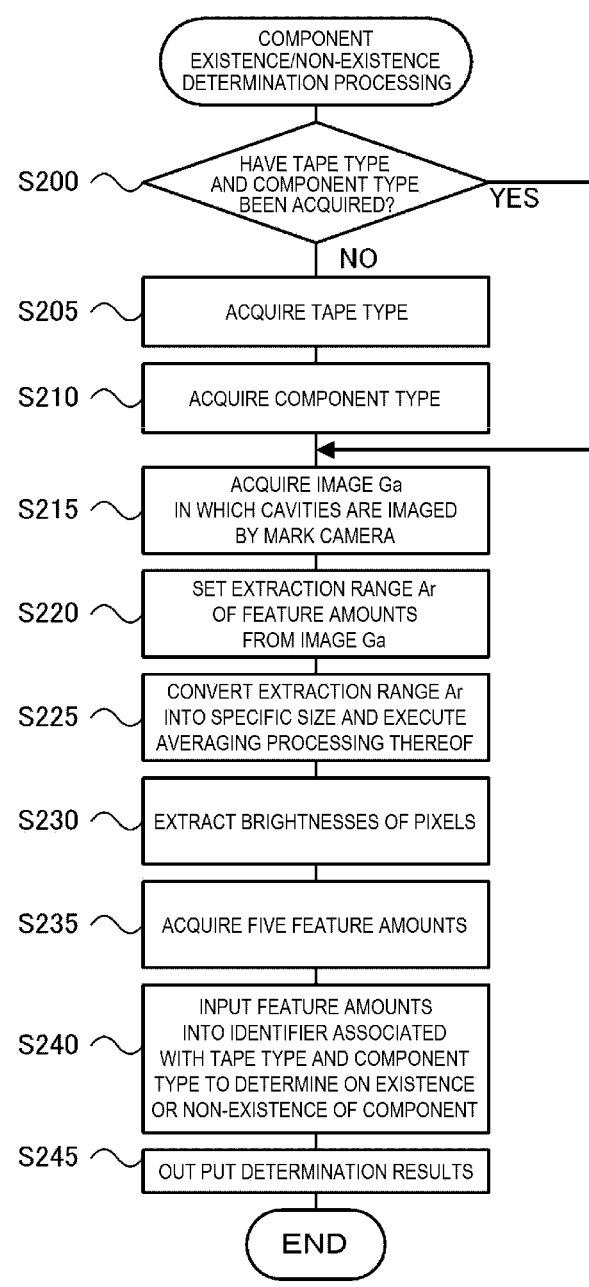
FIG. 9 A flowchart showing an example of determination processing of determining on existence or non-existence of a component inside a cavity.

Next, determination processing of determining on existence or non-existence of a component inside cavity 24 will be described. FIG. 9 is a flowchart showing an example of component existence or non-existence determination processing. This processing is executed by image processing section 34 when a determination timing of determination on existence or non-existence of a component is reached. The determination timing of determination on existence or non-existence of a component corresponds, for example, to a case in which a pickup error of component P by suction nozzle 15 occurs consecutively a predetermined number of times, a case in which new feeder 20 is set in mounting device 10 and tape 22 is fed so as to get ready leading cavity 24 accommodating therein a component, or the like.

In this processing, image processing section 34 first determines whether a tape type and a component type have already been acquired (S 200). If image processing section 34 determines that a tape type and a component type have not yet been acquired, image processing section 34 acquires a tape type (S 205) and acquires a component type (S 210). The processing operations in steps S205, S210 are executed by acquiring a tape type and a component type which are inputted by an operator through, for example, an operation panel, not shown, or the like. Alternatively, a tape type and a component type inputted through communication with the control section of feeder 20 may be acquired. In addition, image processing section 34 may capture an image of a flat surface portion of tape 22 where no cavity 24 is formed and determine on a tape type based on brightnesses of pixels acquired from the image and a reference brightness acquired in advance for each tape type. For example, image processing section 34 can acquire a mean brightness of the individual pixels from the image and determine that the type of relevant tape 22 is a tape type whose reference brightness is closest to the mean brightness thereof.

Figure 10:
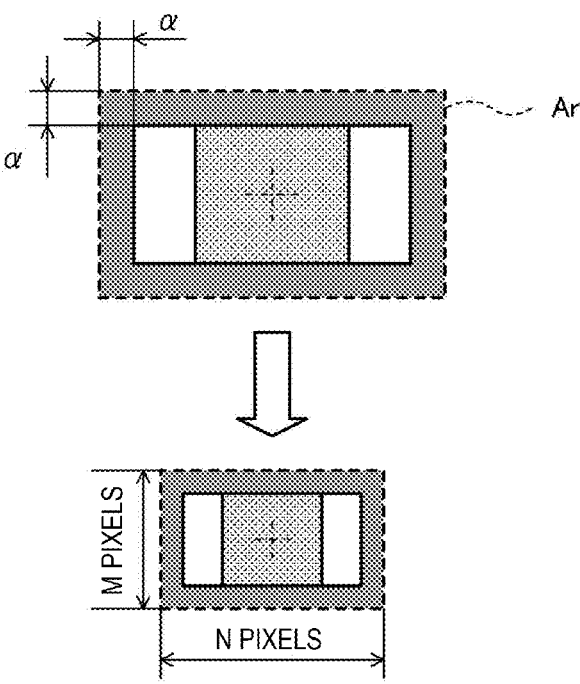
FIG. 10 An explanatory diagram illustrating an example of how to normalize an image.

Subsequently, image processing section 34 acquires image G by imaging cavity 24 with mark camera 18 (S215), and sets extraction range Ar of feature amounts from relevant image G so acquired (S220). This extraction range Ar is the same range as the range set in S105 of the feature amount learning processing. Subsequently, image processing section 34 cuts out an image of extraction range Ar so set, converts the image so cut out into a specific size, and performs averaging processing thereon so as to normalize the image of extraction range Ar (S225). FIG. 10 is an explanatory diagram illustrating an example of how to normalize the image. As illustrated therein, the image of extraction range Ar is converted into an image of a specific size of M vertical pixels×N horizontal pixels. As a result, image sizes of processing targets can be made into a specific size, so that the number of pixels extracted for each image can be made constant. In addition, in S225, noise can be removed by performing averaging processing using a filter such as a Gaussian filter or a moving average filter.

Subsequently, image processing section 34 extracts brightnesses of individual pixels from the image of the specific size (S230), and acquires five feature amounts, that is, maximum brightness, minimum brightness, mean brightness, contrast, and brightness dispersion, based on the brightnesses of the individual pixels so extracted (S235). Then, image processing section 34 inputs the acquired feature amounts to determine on existence or non-existence of a component using identifier 38 corresponding to the tape type and the component type which are acquired in S205, S210 (S240), outputs the determination result (S245), and ends the component existence or non-existence determination processing. For example, if tape type T2 and component type P2 are acquired in S205, S210, respectively, image processing section 34 determines on existence or non-existence of a component using identifier 38 (12).

In addition, in S245, the result of the determination on existence or non-existence of a component is outputted, for example, to drive control section 32, management device 40, or the like. In the case that a suction error of component P occurs consecutively a predetermined number of times, if it is determined that there is no component P available, drive control section 32 causes feeder 20 to feed tape 22 to subsequent cavity 24, whereas if it is determined that there is component P available, drive control section 32 causes head 14 to pick up component P again. In addition, if it is determined that there is component P available while tape 22 is being fed after new feeder 20 is set in mounting device 10, drive control section 32 ends the feeding of tape 22. Additionally, drive control section 32 may display information informing that there is no component available on the operation panel, not illustrated, or the like. In the case that feeder 20 is configured so as to be attached to and detached from mounting device 10 by an exchanging device, not illustrated, having received the determination result informing that there is no component P available, management device 40 outputs a command to exchange feeders 20 to the exchanging device. As a result, if there still remain components P available, the exchanging device can be prevented from exchanging feeders 20.

Here, correspondences between the constituent elements of the present embodiment and constituent elements of the present disclosure will be clarified. Image processing section 34 of the present embodiment corresponds to an image processing device of the present disclosure, cavity 24 corresponds to a cavity, tape 22 corresponds to a tape, image processing section 34 which executes S230, S235 of the component existence or non-existence determination processing corresponds to a feature amount acquisition section, and image processing section 34 which executes S240 of the component existence or non-existence determination processing corresponds to a determining section. Image processing section 34 which executes S205 of the component existence or non-existence determination processing corresponds to a tape type acquisition section. Image processing section 34 which executes S210 of the component existence or non-existence determination processing corresponds to a component type acquisition section. In addition, feeder 20 corresponds to a feeder, mounting device 10 corresponds to a mounting device, and mark camera 18 corresponds to an imaging device. In the present embodiment, describing the operation of image processing section 34 clarifies an example of an image processing method of the present disclosure.

With mounting device 10 described heretofore, image processing section 34 acquires the feature amounts of the brightnesses extracted from image G, and determines on existence or non-existence of a component inside cavity 24 based on the determination thresholds determined based on the feature amounts acquired for each of the case in which a component exists inside the cavity and the case in which no component exists inside the cavity 24 and the feature amounts acquired from the image G. Since the acquired feature amounts exhibit the same tendency depending on existence or non-existence of a component inside cavity 24 whether component types, imaging conditions, or the like differs, existence or non-existence of a component inside cavity 24 can be determined accurately.

In addition, with extraction range Ar defined into a range resulting by adding margins a to the size of component P about a supply position of component P, image processing section 34 extracts brightnesses of the pixels from an image acquired by converting extraction range Ar into a specific size and averaging extraction range Ar so converted. As a result, since the influence of noise can be suppressed by keeping the number of pixels from which brightness is extracted constant, the feature amounts can be acquired in a stable fashion to thereby determine on existence or non-existence of component P accurately.

In addition, since image processing section 34 acquires the type of tape 22 of a processing target and determines on existence or non-existence of component P using identifier 38 corresponding to the tape type so acquired, image processing section 34 can suppress the influence of a change in the feature amount due to difference in material of tape 22. Since image processing section 34 acquires the type of component P of a processing target and determines on existence or non-existence of component P using identifier 38 corresponding to the component type so acquired, image processing section 34 can suppress the influence of a change in the feature amount due to difference in material of tape 22.

In addition, image processing section 34 acquires the five feature amounts of brightness dispersion, maximum brightness, minimum brightness, brightness mean, and contrast. In addition, since existence or non-existence of component P is determined based on identifier 38 in which the threshold is set through the machine learning using the five feature amounts as variables and the five feature amounts acquired from image G, an erroneous determination on existence or non-existence of component P can be prevented from being made by increasing the determination accuracy.

Additionally, with mounting device 10, since image processing section 34 accurately determines on existence or non-existence of component P, the pickup (collection) operation of component P can be prevented from being executed repeatedly with no component P residing inside cavity 24, or the exchanging timing of tapes 22 due to unavailability of components P can be determined appropriately.

Needless to say, the present disclosure is not limited to the embodiment that has been described heretofore in any way, and hence can be carried out in various manners without departing from the technical scope of the present disclosure.

For example, in the embodiment described heretofore, the five feature amounts including brightness dispersion are acquired; however, the present disclosure is not limited thereto, and hence, multiple feature amounts including brightness dispersion or standard deviation and a value on brightness other than the brightness dispersion or the standard deviation need only be acquired. That is, two or more feature amounts including brightness dispersion or standard deviation need only be acquired. In addition, although the brightness dispersion is exemplified as the value indicating the scatter of brightnesses, other indices such as contrast and brightness mean may also be used.

In the embodiment described above, multiple identifiers 38 are associated with both tape type and component type; however, the present disclosure is not limited thereto, and hence, multiple identifiers 38 may be associated with either of tape type and component type. For example, with the acquisition of a component type in S210 in FIG. 9 omitted, image processing section 34 may determine on existence or non-existence of a component using identifier 38 corresponding to the tape type acquired in S205 irrespective of a component type. In addition, with the acquisition of a tape type in S205 in FIG. 9 omitted, image processing section 34 may determine on existence or non-existence of a component using identifier 38 corresponding to the component type acquired in S210 irrespective of a tape type. Alternatively, shared identifier 38 that is associated with neither tape type nor component type may be used. In this case, image processing section 34 need only omit the processing operations in S200 to S210 in FIG. 9.

In addition, necessary identifiers 38 need only be stored in identifier storage section 36 in accordance with the possibility of erroneous determination due to the difference in tape type or component type, the frequency of determination (frequency of use), or the like. For example, identifier 38 associated with tape type may be used for a tape type such as a transparent embossed tape having a high possibility of erroneous determination, identifier 38 associated with tape type and component type may be used for a combination of a tape type having a high possibility of erroneous determination and a component type, or shared identifier 38 may be used for a tape type having a low possibility of erroneous determination or a component type.

In the embodiment described above, pixels are extracted from extraction range Ar of image Ga in the feature amount learning processing; however, the present disclosure is not limited thereto, and hence, pixels may be extracted from an image resulting from normalization of extracted range Ar into a specific size. In addition, in the component existence or non-existence determination processing, pixels are extracted from the image resulting from normalization of extraction range Ar into the specific size; however, the present disclosure is not limited thereto, and hence, pixels may be extracted from extraction range Ar.

In the embodiment described above, the center position of extraction range Ar coincides with center position 24c of component P when relevant component P is picked up by suction nozzle 15; however, the present disclosure is not limited thereto, and hence, extraction range Ar need only be set within the range of cavity 24. In addition, extraction range Ar is referred to as the range resulting from adding margins a to the size of component P; however, extraction range Ar need only be a range where the upper surface of component P and the bottom surface of cavity 24 are captured such as a range slightly narrower than cavity 24 or the like.

In the embodiment described above, the feature amount learning processing is executed by management control section 42 or the like other than image processing section 34; however, the present disclosure is not limited thereto, and hence, the feature amount learning processing may be executed by image processing section 34. The feature amount learning processing by image processing section 34 need only be executed in such a case that no mounting process is carried out. Alternatively, a configuration may be adopted in which an image is captured by mark camera 18 before component P is picked up by suction nozzle 15 during a mounting process, and once component P is picked up, the image is learned as a component-existent image.

In the embodiment described above, the acquired feature amount is inputted into identifier 38 so as to determine on existence or no-existence of component P, that is, the determination result (the identification result) by identifier 38 is obtained; however, the present disclosure is not limited thereto. For example, as illustrated in FIG. 8, in the case that one or more feature amounts such as brightness dispersion are correlated with existence or non-existence of component P and that threshold Sref can be set, a determination may be made using the acquired feature amount and threshold Sref. In the example in FIG. 8, if the acquired brightness dispersion is equal to or larger than threshold Sref, it is determined that there exists component P, whereas if the acquired brightness dispersion is smaller than threshold Sref, it is determined that there exists no component P.

In the embodiment described above, management control section 42 classifies the five feature amounts by existence or non-existence of component P to determine an identification boundary and produces identifiers 38 in which thresholds for use in determination of component existence or non-existence are set based on the identification boundary; however, the present disclosure is not limited thereto. For example, management control section 42 may produce identifiers for determining on existence or non-existence of a component using the identification boundary itself. Further, management control section 42 may produce identifiers each having multiple identification boundaries based on which existence or non-existence of a component is determined. Additionally, management control section 42 may set a weighting coefficient in accordance with a value of coordinates in a multi-dimensional coordinate system made up of multiple feature amounts and produce an identifier for determining on existence or non-existence of a component by a relationship between a value resulting after the multiple feature amounts are weighted by the weighting coefficient and a threshold or an identification boundary.

In the embodiment described above, image processing section 34 provided in mounting device 10 determines on existence or non-existence of component P; however, the present disclosure is not limited thereto, and hence, an image processing device provided on other than mounting device 10 such as management control section 42 of management device 40 may determine on existence or non-existence of component P.

Here, the image processing device of the present disclosure may be configured as follows. For example, in the image processing device of the present disclosure, a configuration may be adopted in which the predetermined range is defined into a range which results by adding a predetermined margin to the size of a component about a supply position where the tape supplies a component in the cavity, and the feature amount acquisition section extracts brightnesses of the pixels from an image acquired by converting the predetermined range in the image into a specific size and averaging the predetermined range so converted. As a result, since brightnesses are extracted from the image of the specific size, the number of pixels from which brightness is extracted can be made constant for each image. In addition, since brightnesses are extracted from the image resulting by converting the predetermined range into the specific size and averaging the predetermined range so converted, the influence of noise can be suppressed. As a result, existence or non-existence of a component inside a cavity can be determined more accurately by acquiring the feature amounts stably.

The image processing device of the present disclosure may adopt a configuration in which a tape type acquisition section for acquiring the type of the tape as a processing target is provided, and the determination section uses a threshold, in the determination thresholds determined individually for the types of the tapes, which is selected by the tape type acquisition section as corresponding to the type of the tape. As a result, existence or non-existence of a component inside a cavity can be determined more accurately by suppressing the influence of a change in the feature amount due to the difference in material or the like of the tapes.

The image processing device of the present disclosure may adopt a configuration in which a component acquisition section for acquiring the type of a component as a supply target is provided, and the determination section uses a threshold, in the determination thresholds determined individually for the types of the components, which is selected by the component type acquisition section as corresponding to the type of the component. As a result, existence or non-existence of a component inside a cavity can be determined more accurately by suppressing the influence of a change in the feature amount due to the difference in material, shape, or the like of the components.

The image processing device according to the present disclosure may adopt a configuration in which the feature amount acquisition section acquires a brightness dispersion or a standard deviation as a value indicating scatter of brightnesses and acquires the multiple feature amounts including a value regarding brightness other than the dispersion and the standard deviation, and the determination section determines on existence or non-existence of a component inside the cavity based on the threshold determined through machine learning using the multiple feature amounts as variables and the multiple feature amounts acquired from the image. As a result, since the accuracy of determination on existence or non-existence of a component inside a cavity can be increased, the occurrence of an erroneous determination on existence or non-existence of a component can be prevented.

According to the gist of another aspect of the present disclosure, there is provided an image processing device for processing an image of a tape having provided therein multiple cavities for receiving a component as a supply target, the image processing device including a feature amount acquisition section configured to extract brightnesses of pixels within a predetermined range which can include a bottom surface of the cavity and a component inside the cavity using the image and acquire a value indicating scatter of the extracted brightnesses as a feature amount, and a determination section configured to determine on existence or non-existence of a component inside the cavity based on a determination identifier produced based on the feature amount for each of a case in which a component exists inside the cavity and a case in which no component exists inside the cavity and the feature amount acquired from the image. As described above, the feature amount acquired from the image exhibits a similar tendency between existence and non-existence of a component inside the cavity. Therefore, even in the event that the component types and imaging conditions change, existence or non-existence of a component inside a cavity can be determined accurately by using the identifier produced based on the feature amount.

According to the gist of a further aspect of the present disclosure, there is provided a mounting device to which a feeder is attached and which is configured to mount a component as a supply target, including either of the image processing devices described heretofore and an imaging device configured to image the tape, wherein the feeder feeds the tape, and wherein the component is picked up from the cavity. With the mounting device of the present disclosure, existence or non-existence of a component inside the cavity can be determined accurately using either of the image processing devices described heretofore. As a result, the component pickup operation can be prevented from being executed repeatedly even though there exists no available component inside the cavity, or a tape exchanging timing, which is triggered by non-availability of a component inside the cavity, can be determined appropriately.

According to the gist of an aspect of the present disclosure, there is provided an image processing method for processing an image of a tape having provided therein multiple cavities for receiving a component as a supply target, the image processing method including (a) a step of extracting brightnesses of pixels within a predetermined range which can include a bottom surface of the cavity and a component inside the cavity using the image and acquiring a value indicating scatter of the extracted brightnesses as a feature amount, and (b) a step of determining on existence or non-existence of a component inside the cavity based on a determination threshold determined based on the feature amount for each of a case in which a component exists inside the cavity and a case in which no component exists inside the cavity and the feature amount acquired from the image. With the image processing method of the present disclosure, as with the image processing device, even in the event that the component types, the imaging conditions, or the like changes, existence or non-existence of a component inside a cavity can be determined accurately. In this image processing method, various aspects of the image processing device described heretofore may be adopted, or steps for realizing the functions of the image processing device described heretofore may be added.

INDUSTRIAL APPLICABILITY

The present disclosure can be applied to a supply device for supplying components accommodated in a tape, a mounting device for mounting the component so supplied, or the like.

REFERENCE SIGNS LIST 10 mounting device, 12 board conveyance device, 14 head, 15 suction nozzle, 16 moving mechanism, 18 mark camera, 19 part camera, 20 feeder, 21 motor, 22 tape, 23 feeding hole, 24 cavity, 24c center position, 30 control device, 32 drive control section, 34 image processing section, 36 identifier storage section, 38 identifier, 40 management device, 42 management control section, 44 input device, 46 display, 48 storage section, G image, P component, Pb body, Pe electrode, S board

The invention claimed is:

1. An image processing device for processing an image of a tape that includes multiple cavities for receiving a component as a supply target, the image processing device comprising:

a feature amount acquisition section configured to extract brightnesses of pixels within a predetermined range which can include a bottom surface of a cavity of the multiple cavities and the component inside the cavity using the image and acquire a value indicating scatter of the extracted brightnesses as a feature amount; and a determination section configured to determine on existence or non-existence of the component inside the cavity based on a determination threshold determined based on the feature amount for each of a case in which the component exists inside the cavity and a case in which no component exists inside the cavity and the feature amount acquired from the image.

2. The image processing device according to claim 1, wherein the predetermined range is defined into a range resulting by adding a predetermined margin to a size of the component about a supply position for use when the tape supplies the component inside the cavity, and wherein the feature amount acquisition section extracts brightnesses of the pixels from an image resulting by converting the predetermined range in the image into a specific size and averaging the predetermined range so converted.

3. The image processing device according to claim 1, further comprising:

a tape type acquisition section configured to acquire a type of the tape as a processing target, wherein the determination section uses a threshold determined individually for types of the tape, the threshold corresponding to the type of the tape acquired by the tape type acquisition section.

4. The image processing device according to claim 1, further comprising:

a component type acquisition section configured to acquire a type of the component as a supply target, wherein the determination section uses a threshold in determined individually for types of the component, the threshold corresponding to the type of the component acquired by the component type acquisition section.

5. The image processing device according to claim 1, wherein the feature amount acquisition section acquires multiple feature amounts including at least one of a brightness dispersion or a standard deviation as a value indicating scatter of brightnesses, and wherein the determination section determines on existence or non-existence of the component inside the cavity based on a threshold determined through machine learning using the multiple feature amounts as variables and the multiple feature amounts acquired from the image.

6. A mounting device to which a feeder is attached and which is configured to mount a component as a supply target, comprising:

the image processing device according to claim 1; and an imaging device configured to image the tape, wherein the feeder feeds the tape, and wherein the component is picked up from the cavity.

7. An image processing method for processing an image of a tape that includes multiple cavities for receiving a component as a supply target, the image processing method comprising:

(a) a step of extracting brightnesses of pixels within a predetermined range which can include a bottom surface of the cavity and the component inside a cavity of the multiple cavities using the image and acquiring a value indicating scatter of the extracted brightnesses as a feature amount; and (b) a step of determining on existence or non-existence of the component inside the cavity based on a determination threshold determined based on the feature amount for each of a case in which the component exists inside the cavity and a case in which no component exists inside the cavity and the feature amount acquired from the image.

* * * * *